(12) United States Patent
Holland

(10) Patent No.: US 12,266,526 B2
(45) Date of Patent: *Apr. 1, 2025

(54) FORMATION OF SINGLE CRYSTAL SEMICONDUCTORS USING PLANAR VAPOR LIQUID SOLID EPITAXY

(71) Applicant: Taiwan Semiconductor Manufacturing Co., Ltd., Hsinchu (TW)

(72) Inventor: Martin Christopher Holland, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/480,378

(22) Filed: Oct. 3, 2023

(65) Prior Publication Data

US 2024/0030027 A1 Jan. 25, 2024

Related U.S. Application Data

(60) Continuation of application No. 17/570,116, filed on Jan. 6, 2022, now Pat. No. 11,784,045, which is a
(Continued)

(51) Int. Cl.
*H01L 29/00* (2006.01)
*C30B 19/10* (2006.01)
(Continued)

(52) U.S. Cl.
CPC ...... *H01L 21/02653* (2013.01); *C30B 19/106* (2013.01); *C30B 19/12* (2013.01); *C30B 29/06* (2013.01); *C30B 29/08* (2013.01); *H01L 21/02488* (2013.01); *H01L 21/02532* (2013.01); *H01L 21/02625* (2013.01);
(Continued)

(58) Field of Classification Search
CPC .... H01L 29/04; H01L 29/045; H01L 29/7838
See application file for complete search history.

(56) References Cited

U.S. PATENT DOCUMENTS 5,429,994 A 7/1995 Ishikawa
5,432,120 A 7/1995 Meister et al.
(Continued)

FOREIGN PATENT DOCUMENTS

WO 2019132891 A1 7/2019

OTHER PUBLICATIONS

Chen et al., "Direct Growth of Single-Crystalline III-V Semiconductors on Amorphous 1 Substrates," *Nature Communications*, 7:10502, Jan. 27, 2016. (6 pages).
(Continued)

*Primary Examiner* — Reema Patel
(74) *Attorney, Agent, or Firm* — Seed IP Law Group

(57) ABSTRACT

A semiconductor device is provided. The semiconductor device includes a template layer disposed over a substrate and having a trench therein, a buffer structure disposed over a bottom surface of the trench and comprising a metal oxide, a single crystal semiconductor structure disposed within the trench and over the buffer structure and a gate structure disposed over a channel region of the single crystal semiconductor structure.

20 Claims, 13 Drawing Sheets

Related U.S. Application Data division of application No. 16/671,107, filed on Oct. 31, 2019, now Pat. No. 11,251,042.

(51) Int. Cl.

| | |
|---|---|
| *C30B 19/12* | (2006.01) |
| *C30B 29/06* | (2006.01) |
| *C30B 29/08* | (2006.01) |
| *H01L 21/02* | (2006.01) |
| *H01L 21/762* | (2006.01) |
| *H01L 29/04* | (2006.01) |
| *H01L 29/06* | (2006.01) |
| *H01L 29/78* | (2006.01) |

(52) U.S. Cl.
CPC .... *H01L 21/02645* (2013.01); *H01L 21/7624* (2013.01); *H01L 29/04* (2013.01); *H01L 29/045* (2013.01); *H01L 29/0649* (2013.01); *H01L 29/7838* (2013.01)

(56) References Cited

U.S. PATENT DOCUMENTS

| | | | |
|---|---|---|---|
| 9,754,843 | B1 | 9/2017 | Patil et al. |
| 11,784,045 | B2* | 10/2023 | Holland .............. C30B 11/12 |
| | | | 257/348 |
| 2001/0045604 | A1 | 11/2001 | Oda et al. |
| 2009/0020853 | A1 | 1/2009 | Kayes et al. |
| 2014/0290737 | A1 | 10/2014 | Javey et al. |
| 2017/0092485 | A1* | 3/2017 | Brueck ............ H01L 21/0243 |
| 2017/0213910 | A1* | 7/2017 | Boeuf ................ H01L 29/16 |
| 2020/0274321 | A1 | 8/2020 | Ghegin et al. |

OTHER PUBLICATIONS

Kapadia et al., "A Direct Thin-Film Path Towards Low-Cost Large-Area III-V 2 Photovoltaics," *Scientific Reports*, 3:2275, Jul. 24, 2013. (7 pages).

* cited by examiner

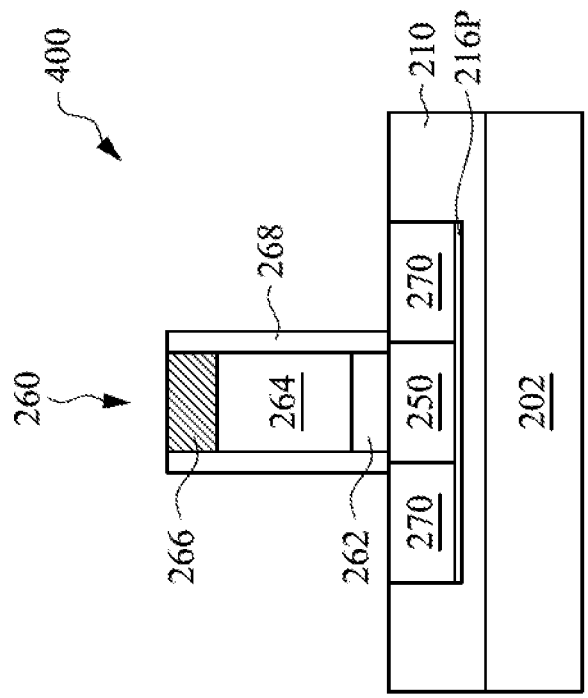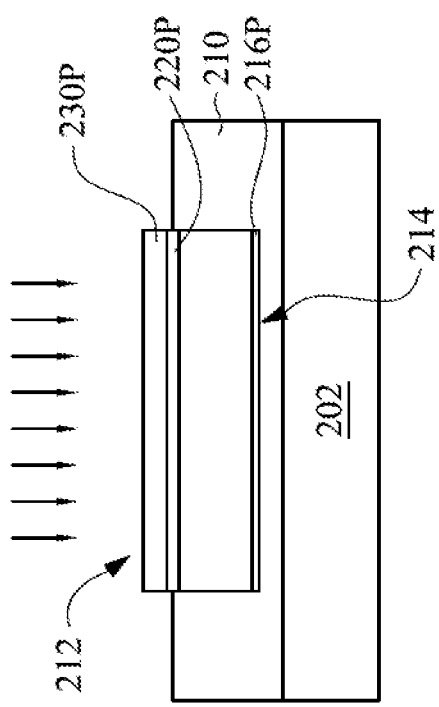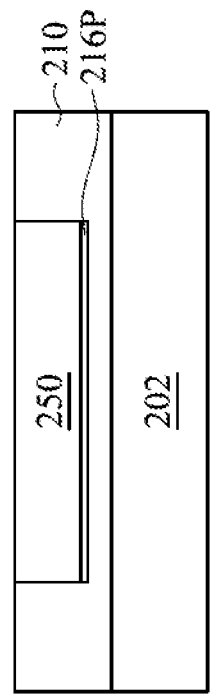
FIG. 4G
FIG. 4E
FIG. 4F

FORMATION OF SINGLE CRYSTAL SEMICONDUCTORS USING PLANAR VAPOR LIQUID SOLID EPITAXY

BACKGROUND

Numerous electronic devices, such as transistors, diodes, photodetectors, and photovoltaics, are built on semiconductor materials. The electronic properties of semiconductor materials stem directly from physical properties, including crystalline structures of the semiconductor materials. Single crystalline semiconductor materials exhibit higher carrier mobility than polycrystalline and amorphous counterparts. As the dimension of device continues to scale, single crystalline semiconductor materials, such as single crystal germanium and single crystal silicon, are essential for achieving high device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4G are cross-sectional views of a semiconductor device at various stages of the fabrication process, in accordance with some embodiments.

DETAILED DESCRIPTION

Figure 1:
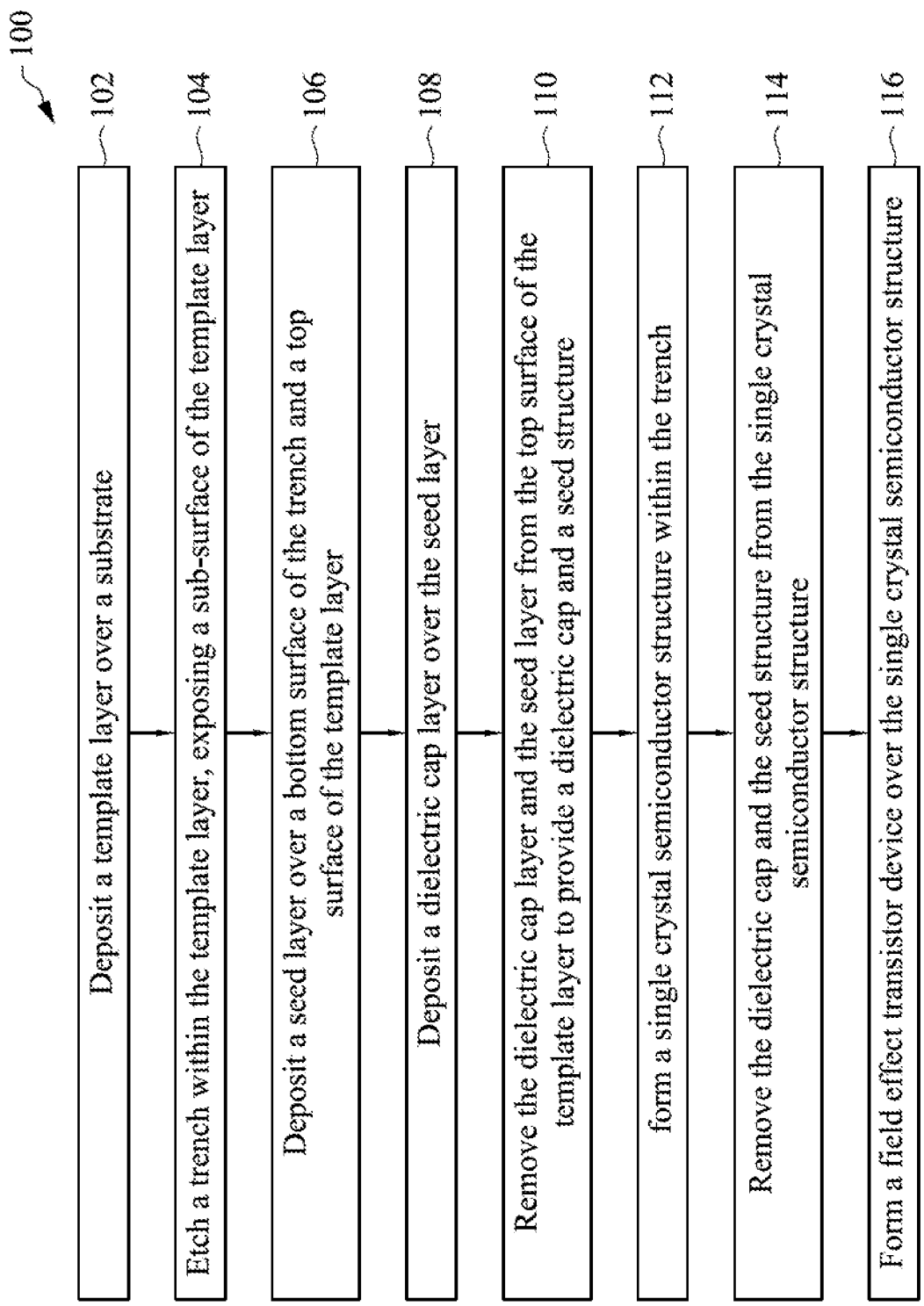
FIG. 1 is a flowchart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Single crystal semiconductor materials are desirable for use as channel materials in metal oxide semiconductor (MOS) transistors due to their high carrier mobility. However, high quality single crystalline semiconductor materials, such as single crystal germanium and single crystal silicon, with relatively low defects, are difficult to manufacture. For example, when germanium is epitaxially grown on a silicon substrate, a lattice mismatch (e.g., about 4%) between germanium and silicon results in defects in the resulting germanium film, which reduces device performance. For another example, growing silicon or germanium on amorphous insulating substrates such as glass substrates normally results in formation of an amorphous or polycrystalline material, rather than a single crystalline material, which makes the construction of the single crystal silicon or germanium less viable. This is because glass is an amorphous substrate, and any silicon or germanium deposited on glass is either amorphous or polycrystalline.

Embodiments of the present disclosure provide methods to grow high quality single crystal Group IV semiconductors including silicon and germanium that have few defects. In embodiments of the present disclosure, a template is used to assist a planar vapor liquid solid (VLS) epitaxy growth process for growing nano- and micro-scale single crystal Group IV semiconductors with user-defined geometries on arbitrary substrates. The ability of growing single crystal Group IV semiconductors on any substrates, such as amorphous substrates or lattice-mismatched substrates, improves device performance and enables new applications. It also provides simplified pathways to heterogeneous integration of germanium and silicon onto application-specific substrates for complementary metal oxide semiconductor (CMOS) logic devices.

Figure 2A:
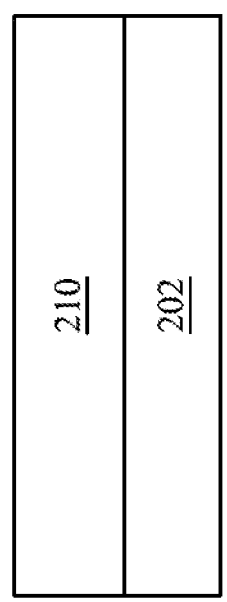
FIGS. 2A-2I are cross-sectional views of a semiconductor device at various stages of the fabrication process, in accordance with some embodiments.
Figure 2B:
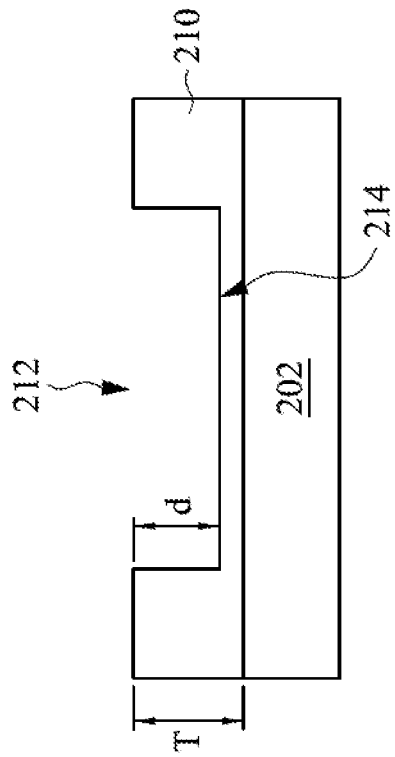
Figure 2C:
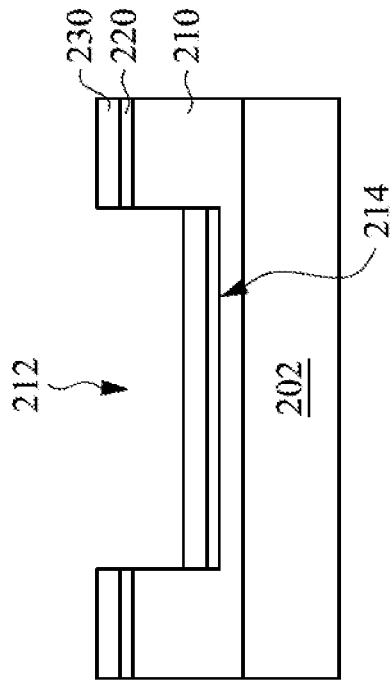
Figure 2D:
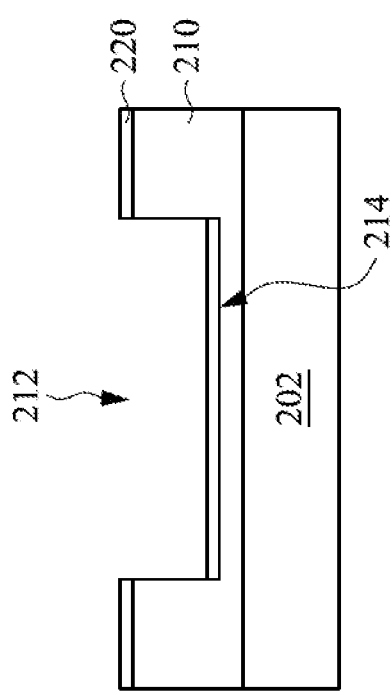
Figure 2E:
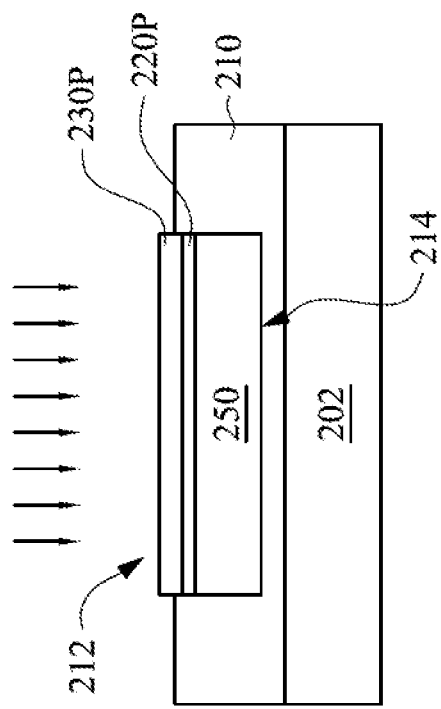
Figure 2F:
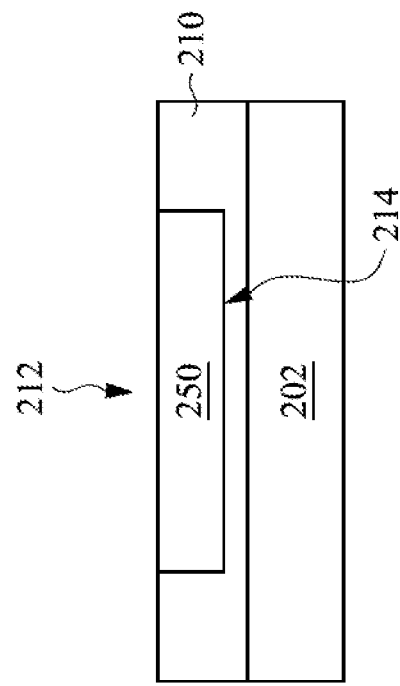
Figure 2G:
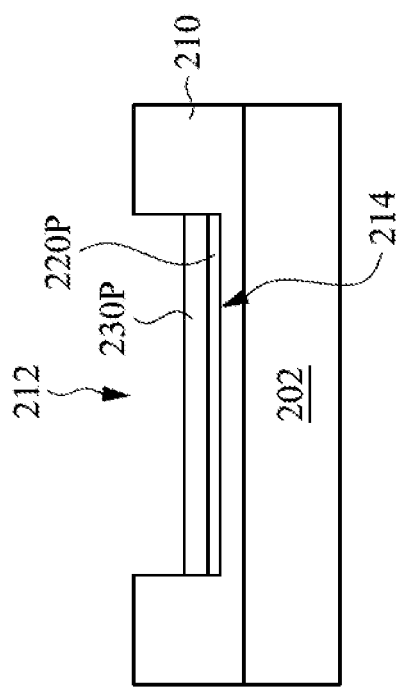
Figure 2H:
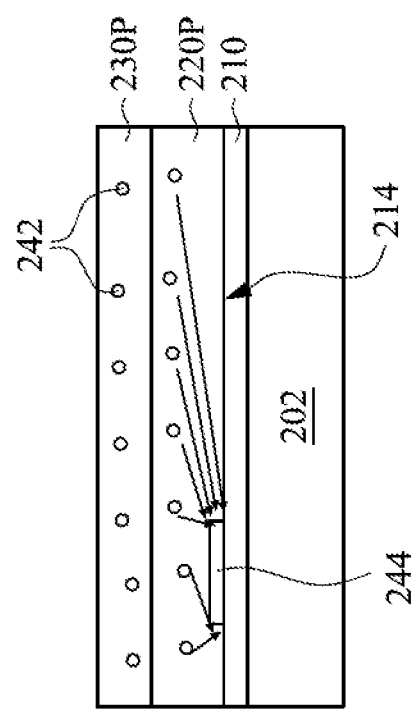
Figure 2I:
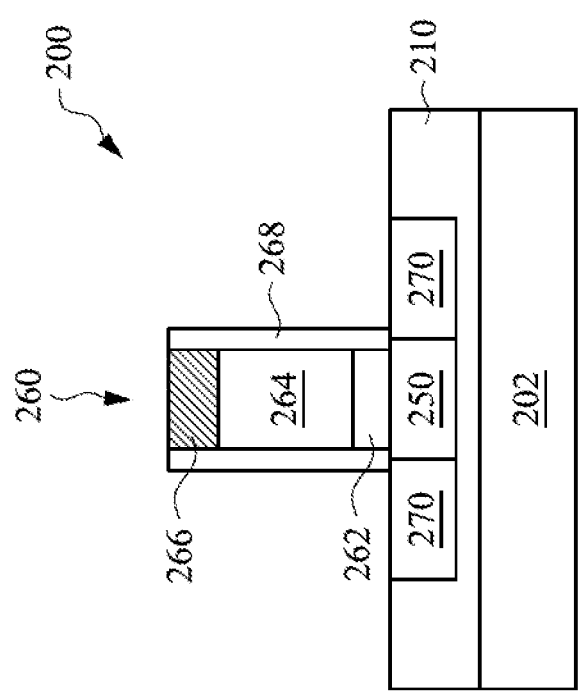

FIG. 1 is a flowchart of a method 100 of fabricating a semiconductor device 200 shown in FIG. 2I, in accordance with some embodiments. FIGS. 2A through 2I are cross-sectional views of the semiconductor device 200 at various stages of the fabrication process, in accordance with some embodiments. The method 100 is discussed in detail below, with reference to the semiconductor structure in FIGS. 2A through 2I. In some embodiments, additional operations are performed before, during, and/or after the method 100, or some of the operations described are replaced and/or eliminated. In some embodiments, additional features are added to the semiconductor device 200. In some embodiments, some of the features described below are replaced or eliminated. One of ordinary skill in the art would understand that although some embodiments are discussed with operations performed in a particular order, these operations may be performed in another logical order.

Referring to FIG. 1, the method 100 includes operation 102, in which a template layer 210 is deposited over a substrate 202. FIG. 2A is a cross-sectional view of a semiconductor structure after depositing the template layer 210 over the substrate 202, in accordance with some embodiments.

In some embodiments, the substrate 202 is a semiconductor substrate including one or more semiconductor materials. In some embodiments, the substrate 202 is comprised of an elemental semiconductor including silicon (Si). In some embodiments, the substrate 202 is comprised of a compound semiconductor including silicon carbide (SiC), gallium arsenide (GaAs), gallium phosphide (GaP), indium phosphide (InP), indium arsenide (InAs), or indium antimonide (InSb); an alloy semiconductor including silicon germanium (SiGe), silicon germanium tin (SiGeSn), gallium arsenic phosphide (GaAsP), aluminum indium arsenide (AlInAs), aluminum gallium arsenide (AlGaAs), gallium indium arsenide (GaInAs), gallium indium phosphide (GaInP), or gallium indium arsenic phosphide (GaInAsP); other suitable materials; or combinations thereof. In some embodiments, the substrate 202 is a glass substrate, a quartz substrate, a metal substrate, or a plastic substrate. In some embodiments, the substrate 202 is a single crystalline silicon substrate having (111) or (001) crystallographic orientation.

The template layer 210 is deposited over the substrate 202. The template layer 210 includes an amorphous material that does not exhibit regular surface orientation. In some embodiments, the template layer 210 includes a dielectric oxide such as, for example, silicon dioxide, or a dielectric nitride such as, for example, silicon nitride. In some embodiments, the template layer 210 is deposited, for example, by chemical vapor deposition (CVD), physical vapor deposition (PVD), plasma enhanced chemical vapor deposition (PECVD), atomic layer deposition (ALD), or other suitable deposition processes. In some embodiments, the template layer 210 is formed by conversion of a topmost portion of the substrate 202 using thermal oxidation, thermal nitridation, plasma oxidation, plasma nitridation, or a combination thereof.

Referring to FIG. 1, the method 100 proceeds to operation 104, in which a trench 212 is etched in the template layer 210. FIG. 2B is a cross-sectional view of the semiconductor device of FIG. 2A after etching the trench 212 in the template layer 210, in accordance with some embodiments. Although FIG. 2A illustrate a single trench 212 being formed in the template layer 210, in some embodiments, a plurality of trenches may be defined and formed in the template layer 210. The plurality of trenches allows forming single crystal silicon and single crystal germanium on the same substrate for fabricating CMOS transistors.

The trench 212 defines a region where subsequent VLS epitaxy growth occurs. The trench 212 resembles the shape of epitaxial semiconductor structure subsequently formed therein. For example, if a square epitaxial semiconductor structure is to be formed on the substrate 202, a trench 212 of a square shape is defined in the template layer 210. If a circular epitaxial semiconductor structure is to be formed on the substrate 202, a trench 212 of a circular shape is defined in the template layer 210. Thus, the trench 212 may be any shape such as square shape, rectangular shape, or circular shape.

The dimension (i.e., a length, a width, and a depth) of the trench 212 is controlled such that a single nucleation site (i.e., a single nucleus) is formed on the bottom surface of the trench to ensure a single crystal semiconductor structure grow within the trench 212 by VLS epitaxy. In some embodiments, the length or the width of the trench 212 is from about 10 nanometers (nm) to about 10 micrometers (µm). In some embodiments, the depth of the trench 212 is set to be less than the length or the width of the trench, to ensure a single crystal semiconductor structure is formed in the trench 212. If dimension of the trench 212 is too small, the size of the resulting single crystal semiconductor structure is too small to have any practical use, in some instances. If the dimension of the trench 212 is too great, multiple nucleation sites (i.e., multiple nuclei) are likely formed. Thus, a single crystal semiconductor structure will not be formed, instead, a polycrystalline semiconductor structure will be formed.

The trench 212 is formed by lithography and etching process. In some embodiments, the lithography process includes applying a photoresist layer (not shown) over the template layer 210, exposing the photoresist layer to a pattern, performing post-exposure baking, and developing the resist to form a patterned photoresist layer (not shown). The patterned photoresist layer exposes a portion of the template layer 210 where the trench 212 is to be formed. Next, the portion of the template layer 210 that is exposed by the patterned photoresist layer is etched to form the trench 212. In some embodiments, the template layer 210 is etched using a dry etch such as, for example, a reactive ion etch (RIE) or a plasma etch. After formation of trench 212 in the template layer 210, the patterned photoresist layer is removed, for example, by wet stripping or plasma ashing. Alternatively, in some embodiments, a hard mask is used such that the trench pattern is transferred from the pattered photoresist layer to the hard mask by a first etch and then transferred to the template layer 210 by a second etch.

In some embodiments, the trench 212 is formed extending into a portion of the template layer 210, exposing a sub-surface of the template layer 210, as shown in FIG. 2B. The depth d of the trench 212 thus is smaller than the thickness T of the template layer 210, and the surfaces of the trench 212 are defined by the amorphous material in the template layer 210.

In some embodiments, after forming the trench 212, a surface conditioning process is performed to condition the trench 212, thus flattening and smoothing a bottom surface 214 of the trench 212. The smoothed bottom surface 214 enables forming a high quality (e.g., defect free) single crystal semiconductor structure thereon, which helps to prevent undesirable variations in operation characteristics of devices formed thereon if the bottom surface 214 has a surface high roughness. In some embodiments, the roughness of the bottom surface 214 of the trench 212 is less than about 1 nm over a 1 µm dimension. The bottom surface 214 of the trench 212 is the sub-surface of template layer 210 as shown in FIG. 2B. The surface conditioning process is optional and in some embodiments is omitted.

Referring to FIG. 1, the method 100 proceeds to operation 106, in which a seed layer 220 is deposited over the bottom surface 214 of the trench 212 and the top surface of the template layer 210. FIG. 2C is a cross-sectional view of the semiconductor device of FIG. 2B after depositing the seed layer 220 over the bottom surface 214 of the trench 212 and the top surface of the template layer 210, in accordance with some embodiments.

The seed layer 220 includes a metal that serves as a catalyst for catalyzing the decomposition of a semiconductor precursor, thereby growing a single crystal semiconductor structure via a VLS epitaxy growth process. In some embodiments, the seed layer 220 includes gallium (Ga), indium (In), or tin (Sn).

In some embodiments, the seed layer 220 is deposited using a selected area metal organic chemical vapor deposition (MOCVD) process or a focused ion beam induced deposition process. As a result, the seed layer 220 is only deposited on the horizontal surfaces, including bottom surface 214 of trench 212, and the top surface of template layer 210, but not on vertical surfaces such as sidewalls of the trench 212. Alternatively, in some embodiments, the seed layer 220 is formed by first depositing a catalyst metal along sidewalls and bottom surface 214 of the trench 212 and over the top surface of the template layer 210 using, for example, CVD, PECVD, or PVD. Subsequently, the deposited catalyst metal is removed from the sidewalls of the trench 212 using an anisotropic etch such as RIE to provide the seed layer 220. One or more types of gaseous organometallic compound, such as trimethyl indium, triethyl gallium, trimethylgallium, trimethyl tin and the like, are used as the seed precursor for deposition of the seed layer 220, in some embodiments.

The thickness of the seed layer 220 is selected to control the diffusion rate of a semiconductor precursor gas to ensure that a single nucleation site is formed on the bottom surface 214 of the trench 212. In some embodiments, the seed layer 220 has a thickness form about 10 nm to about 50 nm. If the thickness of the seed layer 220 is too small, the diffusion of the semiconductor precursor gas through the seed layer 220 becomes too fast. As a result, multiple nucleation sites are likely formed on the bottom surface 214 of the trench 212, resulting in the failure to grow a single crystal semiconductor structure, in some instances. If the thickness of the seed layer 220 is too great, the diffusion of the semiconductor precursor gas through the seed layer 220 becomes too slow. As a result, the crystal growth is unnecessarily retarded, leading to low production throughput, in some instances.

Referring to FIG. 1, the method 100 proceeds to operation 108, in which a dielectric cap layer 230 is deposited over the seed layer 220. FIG. 2D is a cross-sectional view of the semiconductor device of FIG. 2C after depositing the dielectric cap layer 230 over the seed layer 220, in accordance with some embodiments.

The dielectric cap layer 230 is employed to ensure the liquid catalyst metal remain flat during the VLS epitaxy growth process, thereby facilitating the planar semiconductor growth. The dielectric cap layer 230 is permeable to a semiconductor precursor gas, so that the semiconductor precursor gas is able to diffuse through the dielectric cap layer 230 and to grow from the bottom surface 214 of trench 212. In some embodiments, the dielectric cap layer 230 includes a dielectric oxide such as, for example, silicon dioxide or aluminum oxide. In some embodiments, the dielectric cap layer 230 is deposited, for example, by CVD, PECVD, PVD, or ALD. The thickness of the dielectric cap layer 230 is selected to control the diffusion rate of the semiconductor precursor gas. In some embodiments, the dielectric cap layer 230 is deposited to have a thickness from about 40 nm to about 200 nm. If the thickness of the dielectric cap layer 230 is too small, the diffusion of the semiconductor precursor gas through the dielectric cap layer 230 becomes too fast. As a result, multiple nucleation sites are likely formed on the bottom surface 214 of the trench 212, resulting in the failure to grow a single crystal semiconductor structure, in some instances. If the thickness of the dielectric cap layer 230 is too great, the diffusion of the semiconductor precursor gas through the dielectric cap layer 230 becomes too slow. As a result, the crystal growth is unnecessarily retarded, leading to low production throughput, in some instances.

Referring to FIG. 1, the method 100 proceeds to operation 110, in which the dielectric cap layer 230 and the seed layer 220 are removed from the top surface of the template layer 210. FIG. 2E is a cross-sectional view of the semiconductor device of FIG. 2D after removing the dielectric cap layer 230 and the seed layer 220 from the top surface of the template layer 210, in accordance with some embodiments.

In some embodiments, the dielectric cap layer 230 and the seed layer 220 are removed from the top surface of the template layer 210 using a planarization process, such as CMP. As a result, the dielectric cap layer 230 and the seed layer 220 only remain in the trench 212 to promote the planar VLS epitaxy growth of a semiconductor material, and the top surface of the template layer 210 is exposed. After the planarization process, a portion of the seed layer 220 remaining on the bottom surface 214 of the trench 212 constitutes a seed structure 220P, and a portion of the dielectric cap layer 230 remaining on the seed structure 220P constitutes a dielectric cap 230P.

Referring to FIG. 1, the method 100 proceeds to operation 112, in which a single crystal semiconductor structure 250 is formed within the trench 212 using a planar VLS epitaxy growth process. FIG. 2F is a cross-sectional view of the semiconductor device of FIG. 2E after forming the single crystal semiconductor structure 250 within the trench 212, in accordance with some embodiments.

During the planar VLS epitaxy growth process, the substrate 202 and the materials deposited thereon (e.g., the seed structure 220P and the dielectric cap 230P) are placed in a reaction chamber and heated to a growth temperature. The growth temperature is above a melting temperature of the catalyst metal in the seed structure 220P. The seed structure 220P is, thus, melted into a liquid state. In some embodiments, the semiconductor growth temperature is from about 350° C. to about 750° C. As the seed structure 220P is melted, the dielectric cap 230P keeps the liquid catalyst metal flat on the bottom surface 214 of the trench 212 and, thus, helps the liquid catalyst metal to maintain a planar geometry. After the temperature is stabilized, a semiconductor precursor gas is flowed in the reaction chamber, as indicated by arrows. In some embodiments, the semiconductor precursor gas includes a silicon precursor such as silane ($SiH_4$), disilane ($Si_2H_6$), or trisilane ($Si_3H_8$). In some embodiments, the semiconductor precursor gas includes a germanium precursor such as germane ($GeH_4$) or digermane ($Ge_2H_6$). In some embodiments, the semiconductor precursor gas is accompanied by a carrier gas such as helium or other inert gases.

The epitaxial semiconductor growth then occurs following the VLS approach. FIG. 2G is a local enlargement view illustrating an initial stage of the planar VLS epitaxy grow process. As shown in FIG. 2G, a source vapor containing the semiconductor precursor, such as a silicon precursor or a germanium precursor, diffuses through the dielectric cap 230P and dissolves into the seed structure 220P which is in the form of liquid. When the dissolution of the semiconductor atoms 242 in the seed structure 220P reaches a supersaturation level, the nucleation of the semiconductor occurs at the liquid-solid interface, i.e., the interface between the seed structure 220P and the bottom surface 214 of the trench 212. The flow rate of the source vapor is controlled such that only a single semiconductor nucleus 244 is formed at the bottom of the trench 212. Once the semiconductor nucleus 244 is formed, the semiconductor nucleus 244 grows via the diffusion of nearby semiconductor atoms 242 to the semiconductor nucleus 244 and the subsequent incorporation of the semiconductor atoms 242 into the solid phase. The flow rate of the source vapor is controlled so that the diffusion rate of the semiconductor atoms 242 through the seed structure 220P to the semiconductor nucleus 244 is greater than the arrival and migration rate of the semiconductor precursor through the dielectric cap 230P. The diffusion and incorporation of the semiconductor atoms 242 into the semiconductor nucleus 244, thus, create a depletion zone near the semiconductor nucleus 244, preventing further nucleation. As a result, the single crystal semiconductor structure 250 is grown within the trench 212.

The single crystal semiconductor structure 250 grows from the bottom surface 214 of the trench 212 and pushes the seed structure 220P and dielectric cap 230P upwards in the growth direction as the planar VSL growth proceeds. The growth of the single crystal semiconductor structure 250 continues until the single crystal semiconductor structure 250 fills the trench 212, as shown in FIG. 2E. In some embodiments, the single crystal semiconductor structure 250 is allowed to grow at the elevated temperature for about 5 minutes to about 2 hours. Although FIG. 2E illustrates that an entirety of the seed structure 220P floats above the single crystal semiconductor structure 250, it should be understood that in some embodiments, during the planar VLS epitaxy growth process, some catalyst metals from the seed structure 220P may remain at the bottom surface 214 of the trench 212 (not shown). The resulting single crystal semiconductor structure 250, thus, contains a trace amount of catalyst metal.

In some embodiments, when the template layer 210 comprises an amorphous material that does not exhibit regular surface orientation, the single crystal semiconductor structure 250 that is grown from the sub-surface of the template layer 210 (i.e., the bottom surface 214 of the trench 212) has a (111) crystallographic orientation, which has the lowest energy. The orientation of the single crystal semiconductor structure 250 is, thus, independent from the crystalline state of the underlying substrate 202.

Referring to FIG. 1, the method 100 proceeds to operation 114, in which the dielectric cap 230P and the seed structure 220P are removed from the single crystal semiconductor structure 250. FIG. 2H is cross-sectional view of the semiconductor device of FIG. 2F after removing the dielectric cap 230P and the seed structure 220P from the single crystal semiconductor structure 250, in accordance with some embodiments.

In some embodiments, the dielectric cap 230P and the seed structure 220P are moved from the single crystal semiconductor structure 250 by a planarization process. In some embodiments, a CMP process is performed. In some embodiments, the dielectric cap 230P and the seed structure 220P are moved from the single crystal semiconductor structure 250 using an etching process. In some embodiments, an isotropic etch or an anisotropic etch that removes materials of the dielectric cap 230P and seed structure 220P selective to the materials of the template layer 210 and the single crystal semiconductor structure 250 is performed. In some embodiments, the etch is a dry etch, such as RIE, or a wet etch. After the removal, surfaces of the single crystal semiconductor structure 250 and the template layer 210 are coplanar with each other.

Once the single crystal semiconductor structure 250 is formed, standard FET processing steps are performed to form FET devices over the single crystal semiconductor structure 250.

Referring to FIG. 1, the method 100 proceeds to operation 116, in which a FET device including a gate structure 260 over a channel region of the single crystal semiconductor structure 250 and source/drain structures 270 on opposite sides of the gate structures 260 are formed. FIG. 2I is cross-sectional view of the semiconductor device of FIG. 2H after forming the FET device (260, 270), in accordance with some embodiments.

In some embodiments, the FET device (260, 270) is a planar FET device, in which the gate structure 260 is formed on a top surface of single crystal semiconductor structure 250. In some embodiments, the FET device (260, 270) is a fin FET device, in which the single crystal semiconductor structure 250 is patterned to form a single fin or multiple fins, and a gate structure 260 is then formed straddling a portion of each fin. The single crystal semiconductor structure 250 helps to increase performance of the FET device (260, 270) due to the high carrier mobility of the single crystal semiconductor structure 250.

The gate structure 260 includes a gate stack (262, 264, 266) and gate spacers 268 on sidewalls of the gate stack (262, 264, 266). In some embodiments, the gate stack (262, 264, 266) includes a gate dielectric 262, a gate electrode 264, and a gate cap 266. In some embodiments, the gate dielectric 262 includes silicon oxide, silicon nitride, silicon oxynitride, or a combination thereof. Alternately or additionally, in some embodiments, the gate dielectric 262 includes a high dielectric constant (high-k) dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanate ($SrTiO_3$), lanthanum aluminate ($LaAlO_3$), and yttrium oxide ($Y_2O_3$). In some embodiments, the gate electrode 264 includes an electrically conductive material such as tungsten (W), copper (Cu), titanium (Ti), tantalum (Ta), aluminum (Al), nickel (Ni), ruthenium (Ru), palladium (Pd), platinum (Pt), a metal nitride such as titanium nitride (TiN), tungsten nitride (WN), titanium aluminum nitride (TiAlN), or tantalum carbon nitride (TaCN), an alloy, or combinations thereof. In some embodiments, the gate cap 266 includes a dielectric material such as, for example, silicon nitride, silicon carbide, silicon oxynitride, silicon oxycarbide, other suitable dielectric materials, or combinations thereof.

The gate stack (262, 264, 266) is formed by deposition and patterning of gate stack layers including a gate dielectric layer, a gate electrode layer, and a gate cap layer. In some embodiments, the patterning of the gate stack layers is effected by application of a photoresist layer (not shown), lithographic patterning of the photoresist layer, transfer of the pattern in the photoresist layer into the gate stack layers, and removal of the patterned photoresist layer, for example, by ashing. In some embodiments, the materials of the gate stack (262, 264, 266) are sacrificial materials that are subsequently removed, and are replaced with a functional gate stack after formation of source/drain structures 270 for FET device.

The gate spacers 268 are formed on sidewalls of the gate stack. In some embodiments, the gate spacers 268 are utilized to offset subsequently formed doped regions, such as source/drain structures 270. In some embodiments, the gate spacers 268 include a dielectric material such as, for example, silicon nitride, silicon carbide, silicon oxynitride, silicon oxycarbide, other suitable dielectric materials, or combinations thereof. In some embodiments, the gate spacers are formed, for example, by deposition of a conformal dielectric material layer and selective removal of horizontal portions of the deposited conformal dielectric material layer. The remaining vertical portions of the deposited conformal dielectric material layer constitute the gate spacers.

The source/drain structures 270 are doped semiconductor regions. In some embodiments, the source/drain structures 270 include p-type dopants such as, for example, boron for a p-type FET device. In some embodiments, the source/drain structures 270 include n-type dopants such as, for example, arsenic or phosphorus for an n-type FET device. In some embodiments, the source/drain structures 270 are formed by implanting dopants into portions of the single crystal semiconductor structure 250 that are not covered by the gate structure 260 using, for example, ion implantation. In some embodiments, the source/drain structures 270 are raised source/drain structures 270 formed by epitaxially depositing a semiconductor material over portions of the single crystal semiconductor structure 250 on opposite sides of the gate structure 260.

In the present disclosure, by using a template assisted planar VLS epitaxy growth process, a single crystal Group IV semiconductor structure can be grown on a variety of substrates, which broadens the applications of the resulting semiconductor devices. In addition, because the template assisted planar VLS epitaxy growth process allows forming single crystal silicon and single crystal geranium on the same substrate, the method and structure in accordance with the present disclosure permits forming hybrid channel CMOS transistor devices with Si as the p-channel material and Ge as the n-channel material on virtually any type of substrates, either amorphous or crystalline. As a result, the manufacturing cost is reduced.

Figure 3:
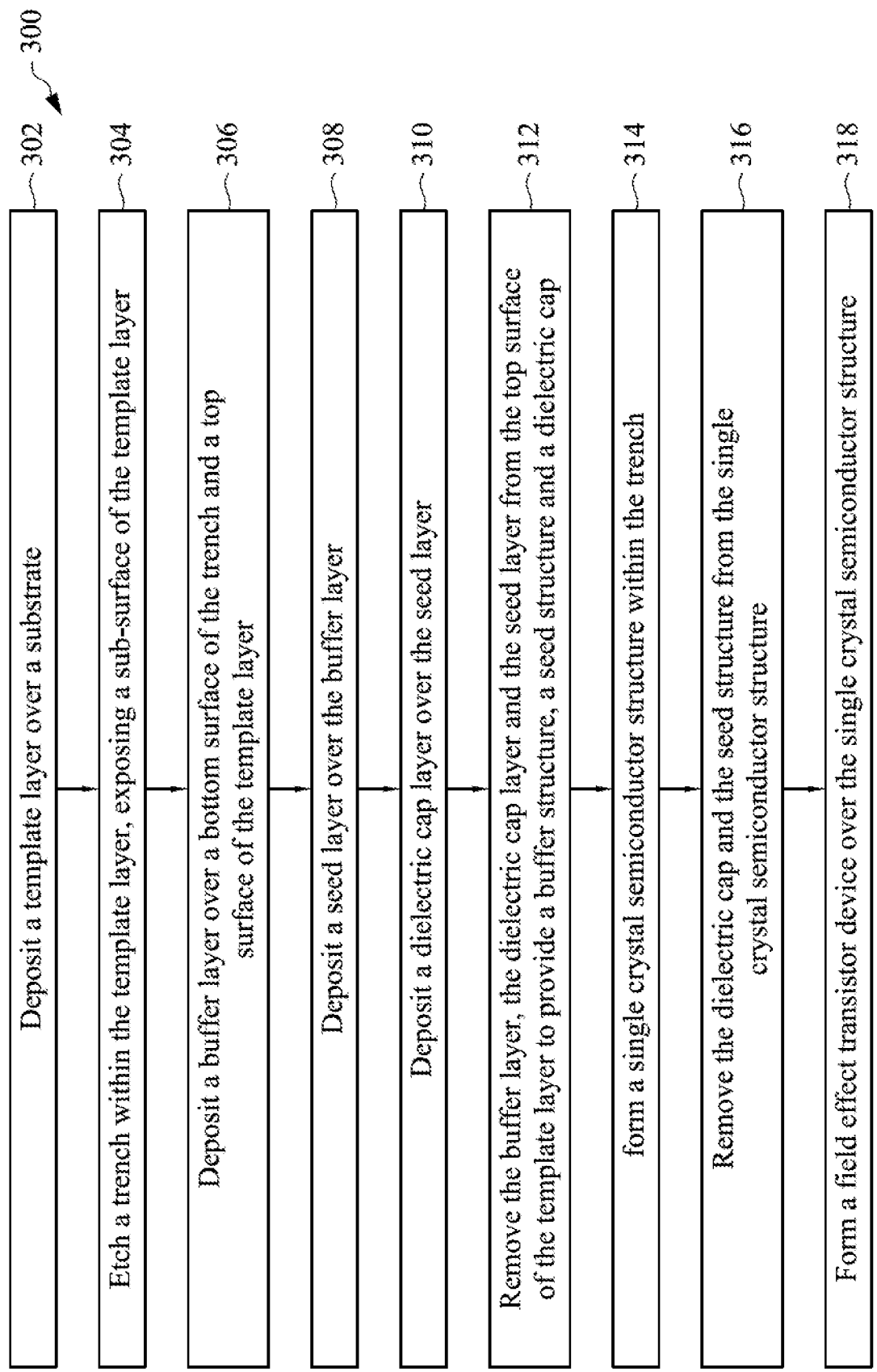
FIG. 3 is a flowchart of a method for fabricating a semiconductor device, in accordance with some embodiments.
Figure 4B:
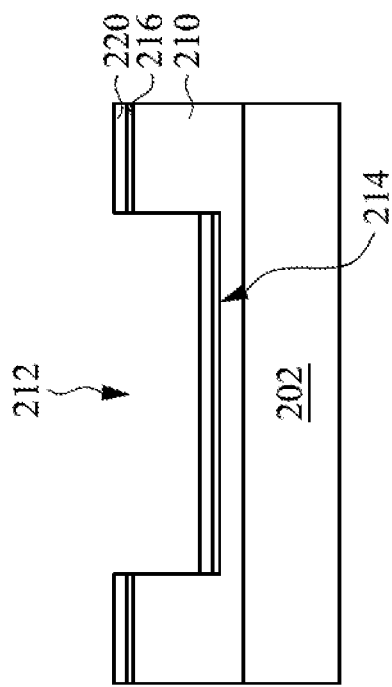

FIG. 3 is a flowchart of a method 300 for fabricating a semiconductor device 400 as shown in FIG. 4G, in accordance with some embodiments. FIGS. 4A through 4G are cross-sectional views of the semiconductor device 400 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2I. The formation details of the embodiment shown in FIGS. 4A through 4G may, thus, be found in the discussion of the embodiments shown in FIGS. 2A through 2I. The method 300 is discussed in detail below, with reference to the semiconductor device 400. The flowchart illustrates only a relevant part of the entire manufacturing process for the semiconductor device 400. It is understood that additional operations may be provided before, during, and after the operations shown by FIG. 3, and some of the operations described below can be replaced or eliminated for additional embodiments of the method. The order of the operations/processes may be interchangeable.

The initial steps of method 300 may be essentially the same as shown in FIGS. 2A through 2B. Referring to FIG. 3, at operation 302, a template layer 210 is deposited over a substrate 202, as shown in FIG. 2A. At operation 304, a trench 212 is etched within the template layer 210, exposing a sub-surface of the template layer 210, as shown in FIG. 2B.

Figure 4D:
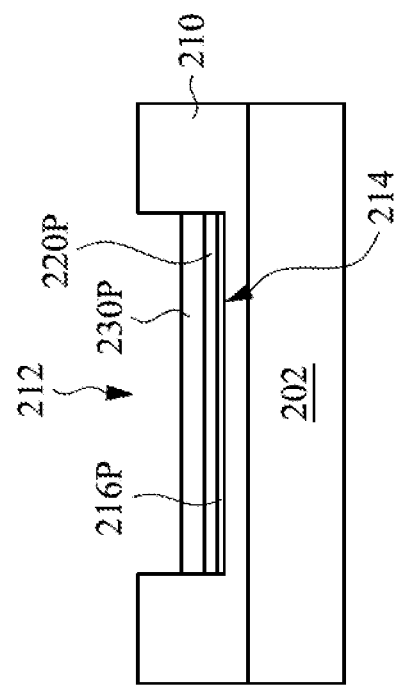
Figure 4A:
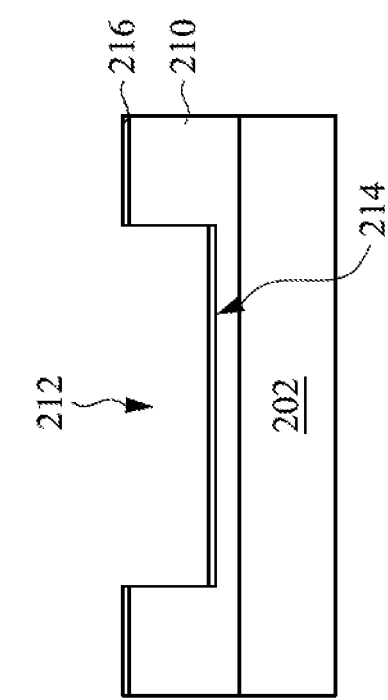

Next, referring to FIG. 3, the method 300 proceeds to operation 306, in which a buffer layer 216 is deposited over the bottom surface 214 of the trench 212 and the top surface of the template layer 210, as shown in FIG. 4A.

The buffer layer 216 is employed to ensure that the catalyst metal subsequently deposited wets the surface of the buffer layer 216 and does not form islands during the catalyst metal deposition process. The buffer layer 216 thus helps to improve the quality and uniformity of the single crystal semiconductor structure later grown by the VSL epitaxy growth process. In some embodiments, the buffer layer 216 includes a metal oxide such as, for example, aluminum oxide ($Al_2O_3$) or molybdenum dioxide ($MoO_2$).

In some embodiments, the buffer layer 216 is deposited by a non-conformal deposition process such as PVD. The non-conformal deposition process causes the buffer material deposited on the horizontal surfaces, i.e., top surface of the template layer 210 and bottom surface 214 of the trench 212, to be thicker than the buffer material deposited on the vertical surfaces, i.e., sidewall surfaces of the trench 212. In some embodiments, the non-conformal deposition process is controlled such that the buffer layer 216 is only deposited on the bottom surface 214 of trench 212 and the top surface of template layer 210, but not on sidewalls of the trench 212. Alternatively, in some embodiments, the non-conformal deposition process proceeds until the deposited buffer material covers both the horizontal surfaces, i.e., top surface of the template layer 210 and the bottom surface 214 of trench 212, and the vertical surfaces, i.e., sidewalls surfaces of the trench 212. After deposition, an etching step is performed to remove the deposited buffer material from the sidewalls of the trench 212. In some embodiments, a dry etch such as RIE is performed. In some embodiments, the etching mask is formed to cover the deposited buffer material on the horizontal surfaces during the etching. In some embodiments, no etching mask is formed to cover the horizontal portions of the deposited material during etching. Because the thickness of the horizontal portions of the deposited buffer material is greater than the thickness of the vertical portions of the deposited buffer material, after the etching, the deposited buffer material remains over the top surface of the template layer 210 and the bottoms surface 214 of the trench 212 to provide the buffer layer 216, while sidewalls of the trench 212 are free of the deposited buffer material. In some embodiments, the buffer layer 216 is deposited to have a thickness from about 0.5 nm to about 1 nm. If the thickness of the buffer layer 216 is too small, the dewetting of the catalyst metal will occur, which adversely affects the VLS epitaxy growth process. If the thickness of the buffer layer 216 is too great, the material is wasted and production costs increase.

Referring to FIG. 3, the method 300 proceeds to operation 308, in which a seed layer 220 is deposited over the buffer layer 216. FIG. 4B is a cross-sectional view of the semiconductor device of FIG. 4A after depositing the seed layer 220 over the buffer layer 216, in accordance with some embodiments. The processes for formation of the seed layer 220 are similar to the processes described above in FIG. 2C and, thus, are not described in detail.

Figure 4C:
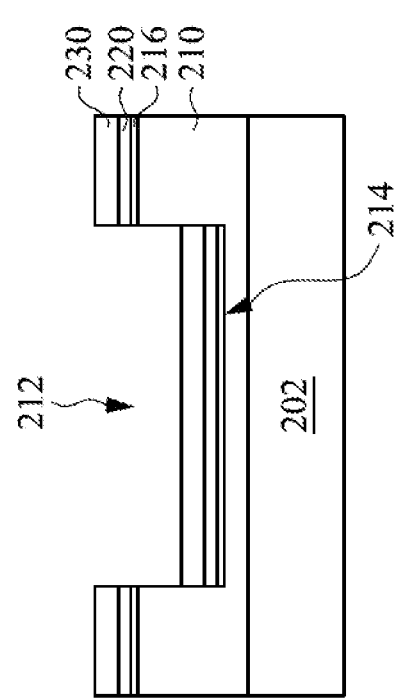

Referring to FIG. 3, the method 300 proceeds to operation 310, in which a dielectric cap layer 230 is deposited over the seed layer 220. FIG. 4C is a cross-sectional view of the semiconductor device of FIG. 4B after depositing the dielectric cap layer 230 over the seed layer 220, in accordance with some embodiments. The processes for formation of the dielectric cap layer 230 are similar to the processes described above in FIG. 2D and, thus, are not described in detail.

Referring to FIG. 3, the method 300 proceeds to operation 312, in which the dielectric cap layer 230, the seed layer 220, and the buffer layer 216 are removed from the top surface of the template layer 210. FIG. 4D is a cross-sectional view of the semiconductor device of FIG. 4C after removing the dielectric cap layer 230, the seed layer 220, and the buffer layer 216 from the top surface of the template layer 210, in accordance with some embodiments.

In some embodiments, the dielectric cap layer 230, the seed layer 220, and the buffer layer are removed from the top surface of the template layer 210 using a planarization process, such as CMP. As a result, the dielectric cap layer 230, the seed layer 220, and the buffer layer only remain in the trench 212, and the top surface of the template layer 210 is exposed. After the planarization process, a portion of the buffer layer 216 remaining on the bottom surface 214 of the trench 212 constitutes a buffer structure 216P, a portion of the seed layer 220 remaining on the buffer structure 216P constitutes a seed structure 220P, and a portion of the dielectric cap layer 230 remaining on the seed structure 220P constitutes a dielectric cap 230P.

Referring to FIG. 3, the method 300 proceeds to operation 314, in which a single crystal semiconductor structure 250 is formed within the trench 212 using a planar VLS epitaxy growth process. FIG. 4E is a cross-sectional view of the semiconductor device of FIG. 4D after forming the single crystal semiconductor structure 250 within the trench 212, in accordance with some embodiments. The processes for formation of the single crystalline semiconductor structure 250 are similar to the processes described above in FIGS. 2F and 2G and, thus, are not described in detail.

Compared to the single crystal semiconductor structure 250 in FIG. 2F, the single crystal semiconductor structure 250 in FIG. 4E is grown from a surface of the buffer structure 216P. The buffer structure 216P helps to increase the quality and uniformity of the seed structure 220P. As a result, the quality of the single crystal semiconductor structure 250 is also enhanced.

Referring to FIG. 3, the method 300 proceeds to operation 316, in which the dielectric cap 230P and the seed structure 220P are removed from the single crystal semiconductor structure 250. FIG. 4F is cross-sectional view of the semiconductor device of FIG. 4E after removing the dielectric cap 230P and the seed structure 220P from the single crystal semiconductor structure 250, in accordance with some embodiments. The processes for removal of the dielectric cap 230P and the seed structure 220P from the single crystal semiconductor structure 250 are similar to the processes described above in FIG. 2H and, thus, are not described in detail. The buffer structure 216P remains beneath the single crystal semiconductor structure 250.

Once the single crystal semiconductor structure 250 is formed, standard FET processing steps are performed to form FETs over the single crystal semiconductor structure 250. Referring to FIG. 3, the method 300 proceeds to operation 318, in which a FET device including a gate structure 260 over a channel region of the single crystal semiconductor structure 250 and source/drain structures 270 on opposite sides of the gate structures 260 are formed. FIG. 4G is cross-sectional view of the semiconductor device of FIG. 4F after forming the FET device (260, 270), in accordance with some embodiments. The processes for forming the FET device (260, 270) are similar to the processes described above in FIG. 2I and, thus, are not described in detail.

Figure 5:
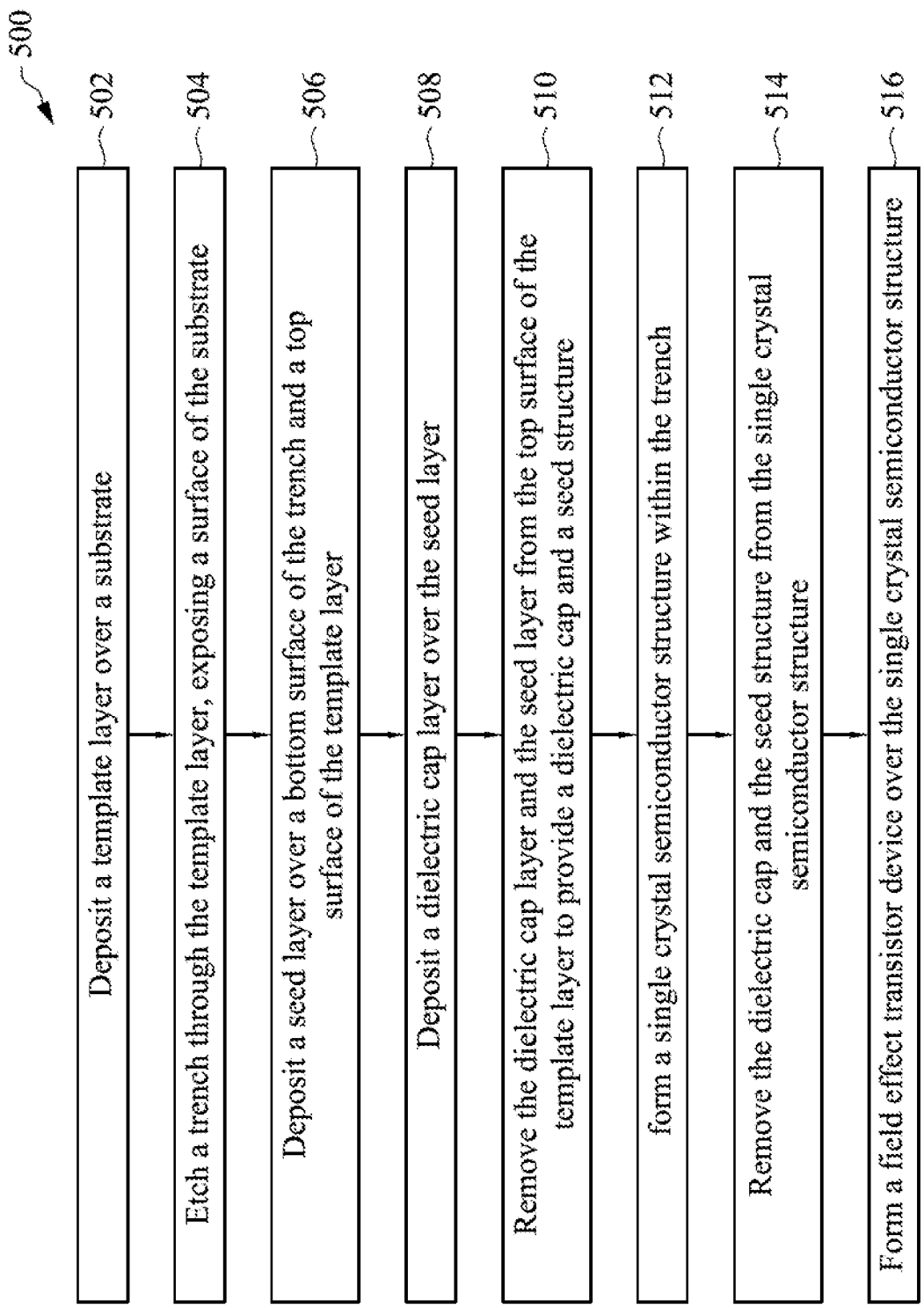
FIG. 5 is a flowchart of a method for fabricating a semiconductor device, in accordance with some embodiments.
Figure 6A:
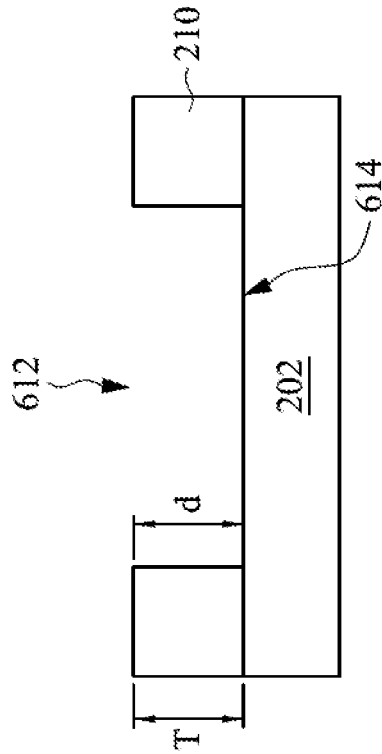
FIGS. 6A-6H are cross-sectional views of a semiconductor device at various stages of the fabrication process, in accordance with some embodiments.
Figure 6B:
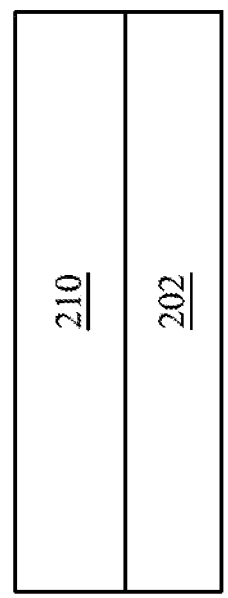
Figure 6C:
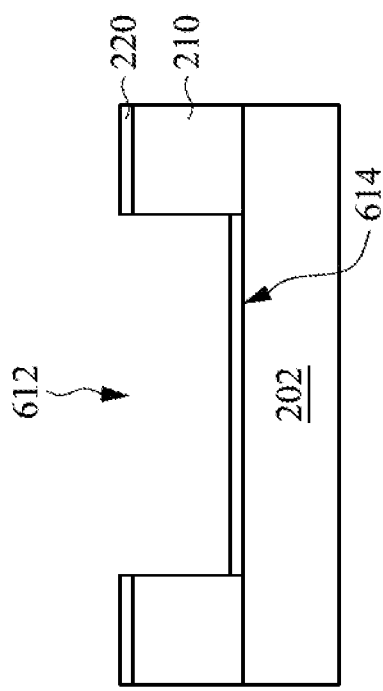
Figure 6D:
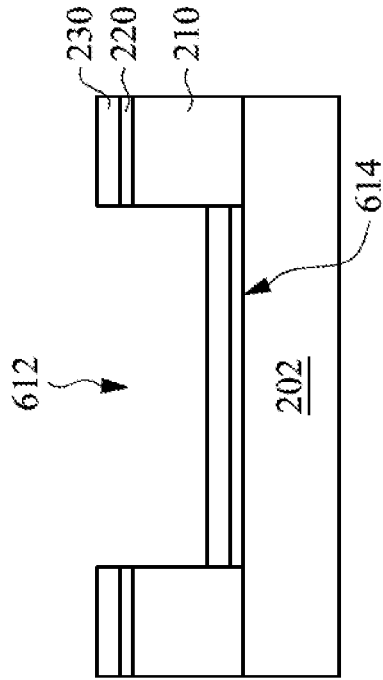
Figure 6F:
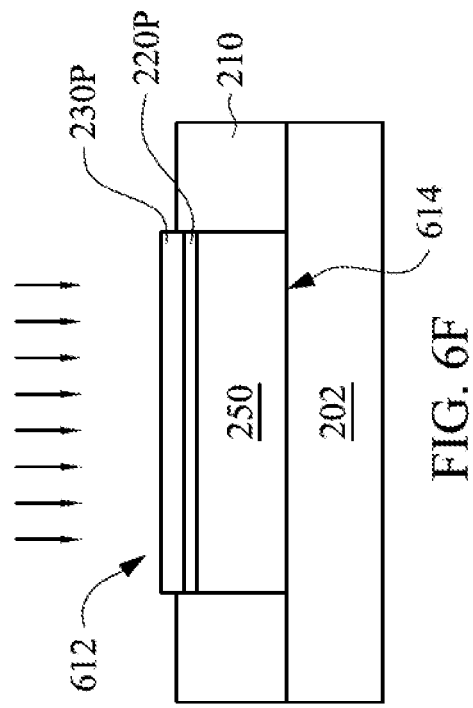
Figure 6H:
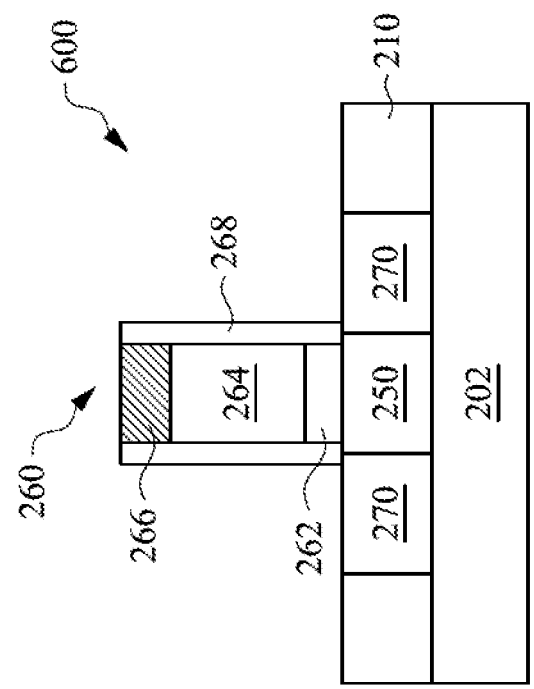

FIG. 5 is a flowchart of a method 500 for fabricating a semiconductor device 600 as shown in FIG. 6H, in accordance with some embodiments. FIGS. 6A through 6H are cross-sectional views of the semiconductor device 600 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2I. The formation details of the embodiment shown in FIGS. 6A through 6H may, thus, be found in the discussion of the embodiments shown in FIGS. 2A through 2I. The method 500 is discussed in detail below, with reference to the semiconductor device 600. The flowchart illustrates only a relevant part of the entire manufacturing process for the semiconductor device 600. It is understood that additional operations may be provided before, during, and after the operations shown by FIG. 5, and some of the operations described below can be replaced or eliminated for additional embodiments of the method. The order of the operations/processes may be interchangeable.

Referring to FIG. 5, the method 500 includes operation 502, in which a template layer 210 is deposited over a substrate 202. FIG. 6A is a cross-sectional view of a semiconductor device after depositing the template layer 210 over the substrate 202, in accordance with some embodiments. The processes for formation of the template layer 210 are similar to the processes described above in FIG. 2A and, thus, are not described in detail.

Referring to FIG. 5, the method 500 proceeds to operation 504, in which a trench 612 is etched through the template layer 210. FIG. 6B is a cross-sectional view of the semiconductor device of FIG. 6A after etching the trench 612 through the template layer 210, in accordance with some embodiments. The processes for etching the trench 612 are similar to the processes described above in FIG. 2B in formation of trench 212 and, thus, are not described in detail.

Compared to the trench 212 in FIG. 2B, the trench 612 is formed to extend through an entire thickness of the template layer 210, thereby exposing a surface of the substrate 202. The depth d of the trench 612 is, thus, the same as the thickness T of the template layer 210. As in FIG. 6B, the bottom surface 614 of the trench 612 is the top surface of the substrate 202.

Referring to FIG. 5, the method 500 proceeds to operation 506, in which a seed layer 220 is deposited over the bottom surface 614 of the trench 612 and the top surface of the template layer 210. FIG. 6C is a cross-sectional view of the semiconductor device of FIG. 6B after depositing the seed layer 220 over the bottom surface 614 of the trench 612 and the top surface of the template layer 210, in accordance with some embodiments. As shown in FIG. 6B, the seed layer 220 contacts the surface of the substrate 202. The processes for formation of the seed layer 220 are similar to the processes described above in FIG. 2C and, thus, are not described in detail.

Referring to FIG. 5, the method 500 proceeds to operation 508, in which a dielectric cap layer 230 is deposited over the seed layer 220. FIG. 6D is a cross-sectional view of the semiconductor device of FIG. 6C after depositing the dielectric cap layer 230 over the seed layer 220, in accordance with some embodiments. The processes for formation of the dielectric cap layer 230 are similar to the processes described above in FIG. 2D and, thus, are not described in detail.

Figure 6E:
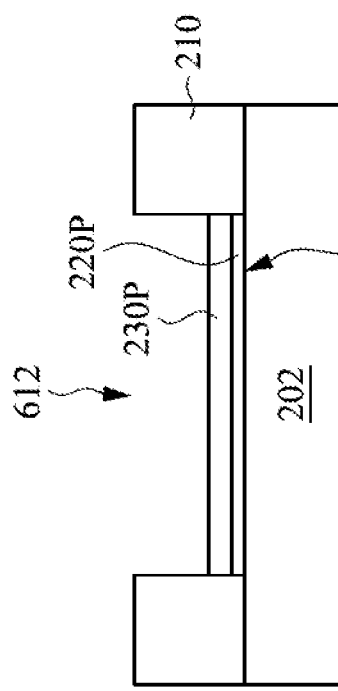

Referring to FIG. 5, the method 500 proceeds to operation 510, in which the dielectric cap layer 230 and the seed layer 220 are removed from the top surface of the template layer 210. FIG. 6E is a cross-sectional view of the semiconductor device of FIG. 6D after removing the dielectric cap layer 230 and the seed layer 220 from the top surface of the template layer 210, in accordance with some embodiments. The processes for removing the dielectric cap layer 230 and the seed layer 220 are removed from the top surface of the template layer 210 are similar to the processes described above in FIG. 2E and, thus, are not described in detail.

Referring to FIG. 5, the method 500 proceeds to operation 512, in which a single crystal semiconductor structure 250 is formed within the trench 612 using a planar VLS epitaxy growth process. FIG. 6F is a cross-sectional view of the semiconductor device of FIG. 6E after forming the single crystal semiconductor structure 250 within the trench 612, in accordance with some embodiments. The processes for formation of the single crystal semiconductor structure 250 are similar to the processes described above in FIGS. 2F and 2G and, thus, are not described in detail.

Compared to the single crystal semiconductor structure 250 in FIG. 2F, the single crystal semiconductor structure 250 in FIG. 6F is grown from a surface of the substrate 202. In instances wherein the substrate 202 is a single crystal substrate, the planar VSL epitaxy growth process leads to a single crystal semiconductor structure 250 with the same crystallographic orientation as the underlying substrate 202. For example, when the substrate 202 is a single crystal silicon substrate having a (001) crystallographic orientation, the resulting single crystal semiconductor structure 250 also has a (001) crystallographic orientation. The orientation of the single crystal semiconductor structure 250 is, thus, controlled by the underlying substrate 202.

Figure 6G:
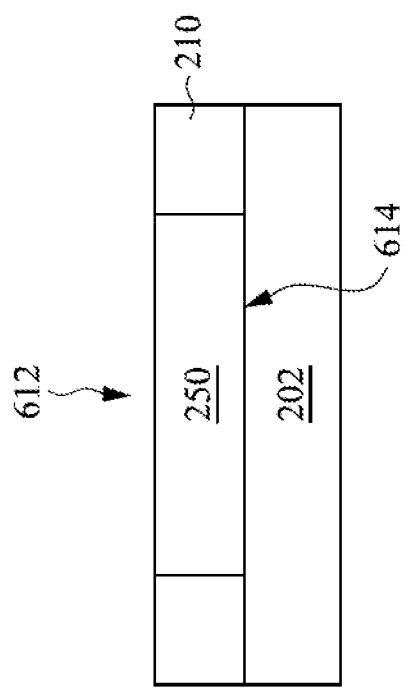

Referring to FIG. 5, the method 500 proceeds to operation 512, in which the dielectric cap 230P and the seed structure 220P are removed from the single crystal semiconductor structure 250. FIG. 6G is cross-sectional view of the semiconductor device of FIG. 6F after removing the dielectric cap 230P and the seed structure 220P from the single crystal semiconductor structure 250, in accordance with some embodiments. The processes for removal of the dielectric cap 230P and the seed structure 220P from the single crystal semiconductor structure 250 are similar to the processes described above in FIG. 2H and, thus, are not described in detail.

Once the single crystal semiconductor structure 250 is formed, standard FET processing steps are performed to form FETs over the single crystal semiconductor structure 250. Referring to FIG. 5, the method 500 proceeds to operation 516, in which a FET device including a gate structure 260 over a channel region of the single crystal semiconductor structure 250 and source/drain structures 270 on opposite sides of the gate structures 260 are formed. FIG. 6H is cross-sectional view of the semiconductor device of FIG. 6G after forming the FET device (260, 270), in accordance with some embodiments. The processes for forming the FET device (260, 270) are similar to the processes described above in FIG. 2I and, thus, are not described in detail.

In embodiments of the present disclosure, by using a template layer to assist the planar VLS epitaxy growth process, a single crystal Group IV semiconductor structure can be grown on a single crystalline semiconductor substrate. The resulting single semiconductor structure has a crystallographic orientation the same as the underlying semiconductor substrate. The present disclosure, thus, helps to form the single crystal semiconductor structure with optimum crystallographic orientations for achieving improved device performance in different applications.

Figure 7:
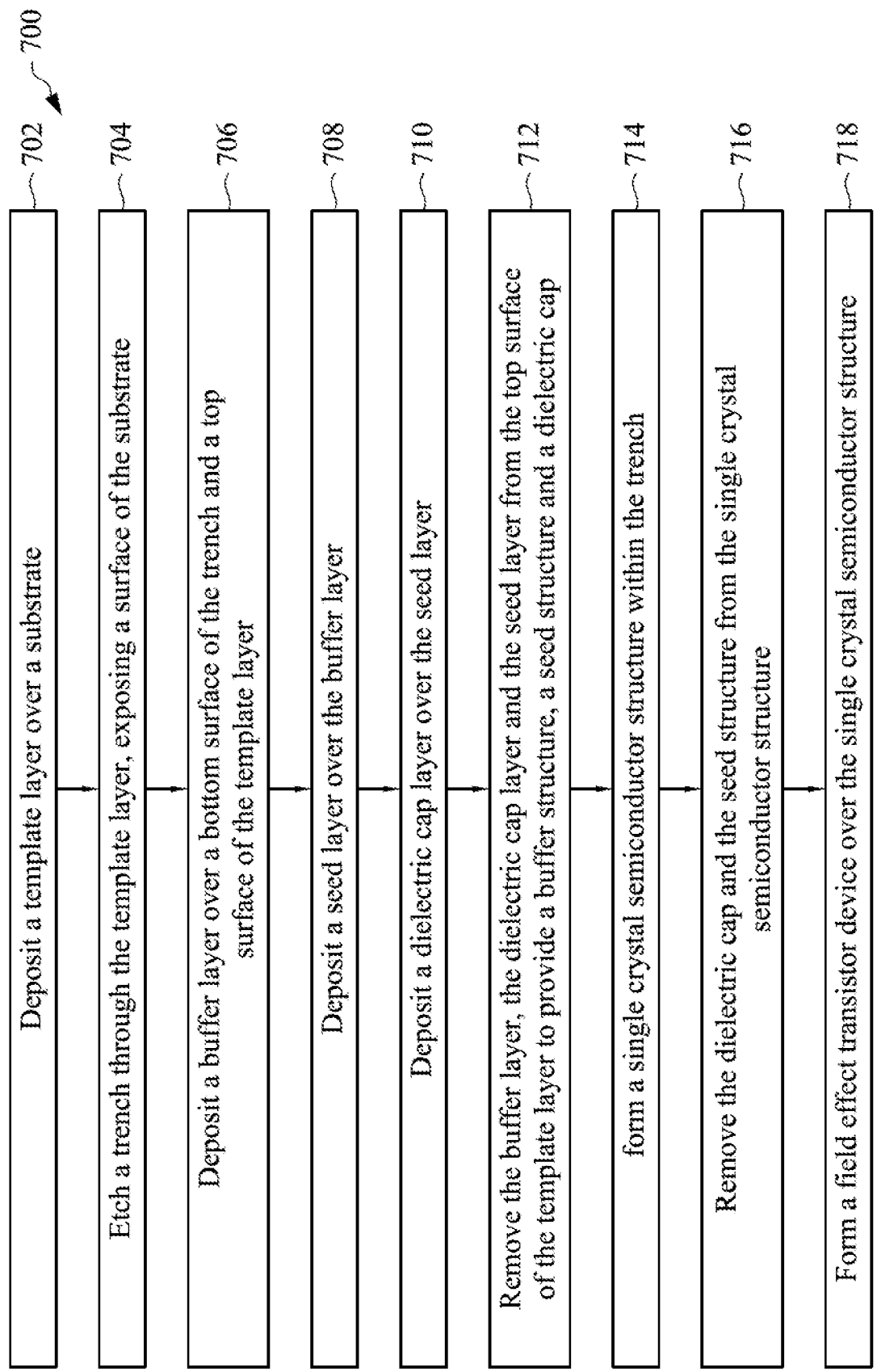
FIG. 7 is a flowchart of a method for fabricating a semiconductor device, in accordance with some embodiments.
Figure 8A:
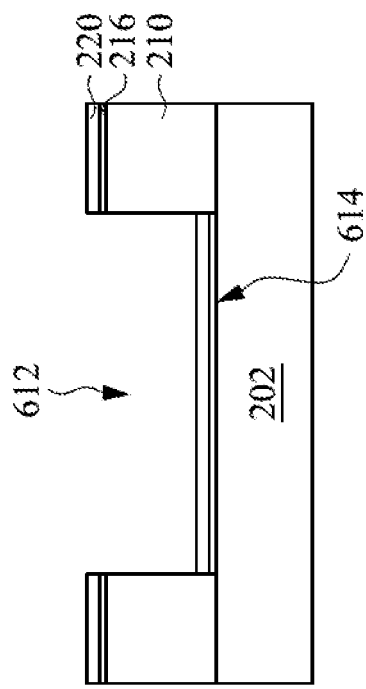
FIGS. 8A-8G are cross-sectional views of a semiconductor device at various stages of the fabrication process, in accordance with some embodiments.
Figure 8B:
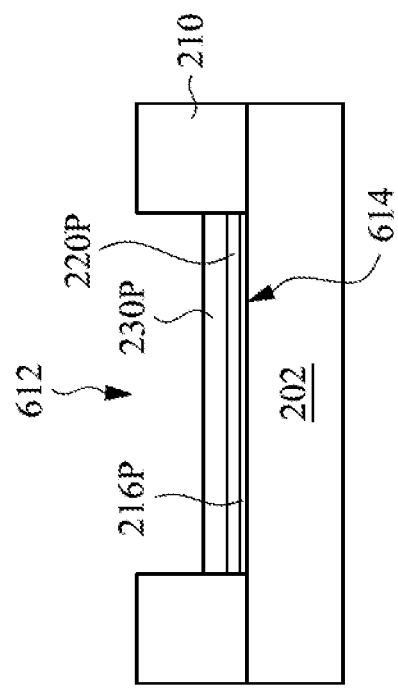
Figure 8C:
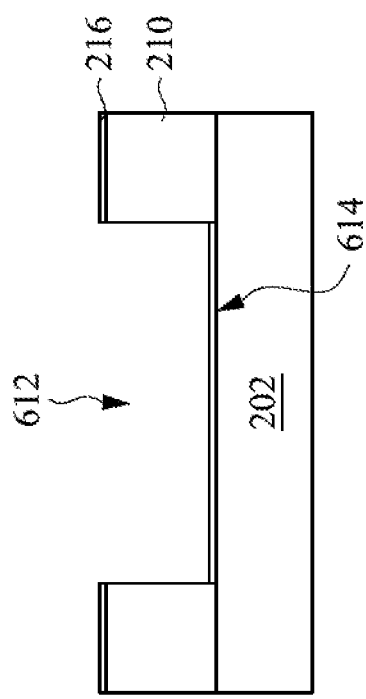
Figure 8D:
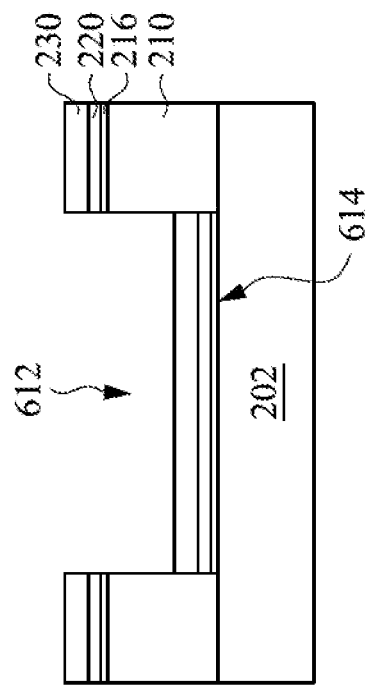
Figure 8G:
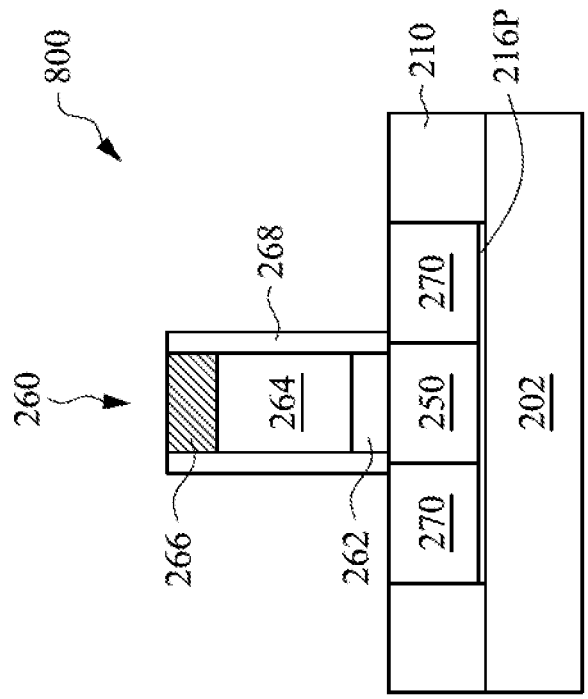

FIG. 7 is a flowchart of a method 700 for fabricating a semiconductor device 800 as shown in FIG. 8G, in accordance with some embodiments. FIGS. 8A through 8G are cross-sectional views of the semiconductor device 800 at various stages of the fabrication process, in accordance with some embodiments. Unless specified otherwise, the materials and formation methods of the components in these embodiments are essentially the same as the like components, which are denoted by like reference numerals in the embodiments shown in FIGS. 6A through 6H. The formation details of the embodiment shown in FIGS. 8A through 8G may, thus, be found in the discussion of the embodiments shown in FIGS. 6A through 6H as well as the embodiments shown in FIGS. 4A-4G. The method 700 is discussed in detail below, with reference to the semiconductor device 800. The flowchart illustrates only a relevant part of the entire manufacturing process for the semiconductor device 800. It is understood that additional operations may be provided before, during, and after the operations shown by FIG. 7, and some of the operations described below can be replaced or eliminated for additional embodiments of the method. The order of the operations/processes may be interchangeable.

The initial steps of method 700 may be essentially the same as shown in FIGS. 6A through 6B. Referring to FIG. 7, at operation 702, a template layer 210 is deposited over a substrate 202, as shown in FIG. 6A. At operation 704, a trench 612 is etched through the template layer 210, exposing a surface of the substrate 202, as shown in FIG. 6B.

Next, referring to FIG. 7, the method proceeds to operation 706, in which a buffer layer 216 is deposited over the bottom surface 614 of the trench 612 and the top surface of the template layer 210, as shown in FIG. 8A. The buffer layer 216 is formed to contact the surface of the substrate 202. The processes for formation of the buffer layer 216 are similar to the processes described above in FIG. 4A and, thus, are not described in detail.

Referring to FIG. 7, the method 700 proceeds to operation 708, in which a seed layer 220 is deposited over the buffer layer 216. FIG. 8B is a cross-sectional view of the semiconductor device of FIG. 8A after depositing the seed layer 220 over the buffer layer 216, in accordance with some embodiments. The processes for formation of the seed layer 220 are similar to the processes described above in FIG. 2C and, thus, are not described in detail.

Referring to FIG. 7, the method 700 proceeds to operation 710, in which a dielectric cap layer 230 is deposited over the seed layer 220. FIG. 8C is a cross-sectional view of the semiconductor device of FIG. 8B after depositing the dielectric cap layer 230 over the seed layer 220, in accordance with some embodiments. The processes for formation of the dielectric cap layer 230 are similar to the processes described above in FIG. 2D and, thus, are not described in detail.

Referring to FIG. 7, the method 700 proceeds to operation 712, in which the dielectric cap layer 230, the seed layer 220, and the buffer layer 216 are removed from the top surface of the template layer 210. FIG. 8D is a cross-sectional view of the semiconductor device of FIG. 8C after removing the dielectric cap layer 230, the seed layer 220, and the buffer layer 216 from the top surface of the template layer 210, in accordance with some embodiments. The processes for removal of the dielectric cap layer 230, the seed layer 220, and the buffer layer 216 from the top surface of the template layer 210 are similar to the processes described above in FIG. 8D and, thus, are not described in detail.

After the planarization process, a portion of the buffer layer 216 remaining on the bottom surface 614 of the trench 612 constitutes a buffer structure 216P, a portion of the seed layer 220 remaining on the buffer structure 216P constitutes a seed structure 220P, and a portion of the dielectric cap layer 230 remaining on the seed structure 220P constitutes a dielectric cap 230P.

Figure 8E:
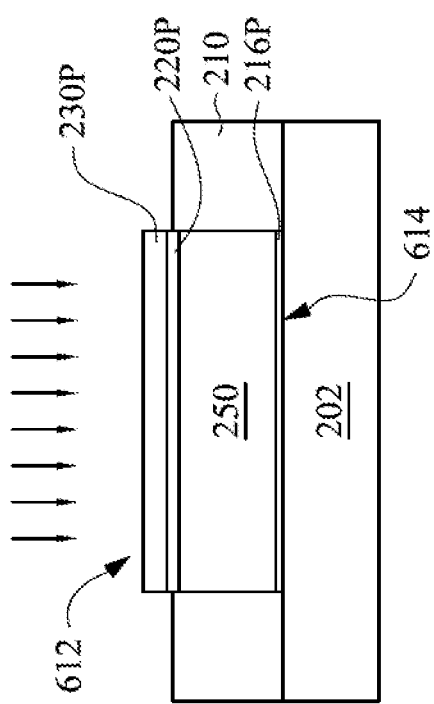

Referring to FIG. 7, the method 700 proceeds to operation 714, in which a single crystal semiconductor structure 250 is formed within the trench 212 using a planar VLS epitaxy growth process. FIG. 8E is a cross-sectional view of the semiconductor device of FIG. 8D after forming the single crystal semiconductor structure 250 within the trench 212, in accordance with some embodiments. The processes for formation of the single crystalline semiconductor structure 250 are similar to the processes described above in FIGS. 2F and 2G and, thus, are not described in detail.

Compared to the single crystal semiconductor structure 250 in FIG. 6F, the single crystal semiconductor structure 250 in FIG. 8E is grown from a surface of the buffer structure 216P. The buffer structure 216P helps to increase the quality and uniformity of the seed structure 220P. As a result, the quality of the single crystal semiconductor structure 250 is also enhanced. Further, because the thickness of the buffer structure 216P is quite thin, the presence of the buffer structure 216P does not affect the crystallographic orientation of the single crystal semiconductor structure 250. The crystallographic orientation of the single crystal semiconductor structure is still determined by the underlying substrate 202.

Figure 8F:
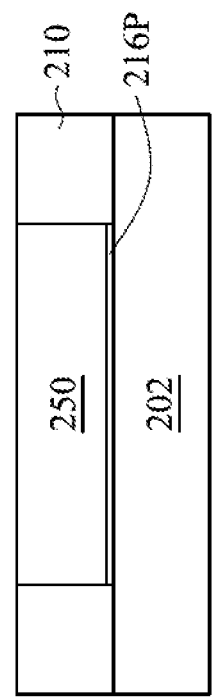

Referring to FIG. 7, the method 700 proceeds to operation 716, in which the dielectric cap 230P and the seed structure 220P are removed from the single crystal semiconductor structure 250. FIG. 8F is cross-sectional view of the semiconductor device of FIG. 8E after removing the dielectric cap 230P and the seed structure 220P from the single crystal semiconductor structure 250, in accordance with some embodiments. The processes for removal of the dielectric cap 230P and the seed structure 220P from the single crystal semiconductor structure 250 are similar to the processes described above in FIG. 2H and, thus, are not described in detail. The buffer structure 216P remains beneath the single crystal semiconductor structure 250.

Once the single crystal semiconductor structure 250 is formed, standard FET processing steps are performed to form FETs over the single crystal semiconductor structure 250. Referring to FIG. 7, the method 700 proceeds to operation 718, in which a FET device including a gate structure 260 over a channel region of the single crystal semiconductor structure 250 and source/drain structures 270 on opposite sides of the gate structures 260 are formed. FIG. 8G is cross-sectional view of the semiconductor device of FIG. 8F after forming the FET device (260, 270), in accordance with some embodiments. The processes for forming the FET device (260, 270) are similar to the processes described above in FIG. 2I and, thus, are not described in detail.

One aspect of this description relates to a method of forming a semiconductor structure. The method includes etching a trench in a template layer over a substrate, forming a seed structure over a bottom surface of the trench, forming a dielectric cap over the seed structure; and growing a single crystal semiconductor structure within the trench using a vapor liquid solid epitaxy growth process. The single crystal semiconductor structure is grown from a liquid-solid interface between the seed structure and the bottom surface of the trench. In some embodiments, the method further includes removing the dielectric cap and the seed structure from a top surface of the single crystal semiconductor structure. In some embodiments, growing the single crystal semiconductor structure includes growing single crystal silicon or single crystal germanium. In some embodiments, the method further includes depositing a seed layer over the bottom surface of the trench and a top surface of the template layer. In some embodiments, depositing the seed layer includes depositing the seed layer using a focused ion beam induced deposition process. In some embodiments, depositing the seed layer includes depositing a catalyst metal comprising gallium, tin, or indium. In some embodiments, the method further includes depositing a dielectric cap layer over the seed layer. In some embodiments, depositing the dielectric cap layer includes depositing a dielectric oxide. In some embodiments, the method further includes removing the dielectric cap layer and the seed layer from the top surface of the template layer. A portion of the seed layer remaining on the bottom surface of the trench constitutes the seed structure and a portion of the dielectric cap layer remaining on the seed structure constitutes the dielectric cap. In some embodiments, growing the single crystal semiconductor structure includes heating the substrate, the seed structure, and the dielectric cap to a temperature above a melting temperature of a catalyst metal in the seed structure. The seed structure is melted to be in a liquid form to provide the liquid-solid interface between the seed structure and the bottom surface of the trench. In some embodiments, growing the single crystal semiconductor structure further includes flowing a semiconductor precursor gas to the dielectric cap.

Another aspect of this description relates to a method of forming a semiconductor structure. The method includes etching a trench in a template layer over a substrate, depositing a buffer layer over a bottom surface of the trench and a top surface of the template layer, forming a seed layer over the buffer layer, forming a dielectric cap layer over the seed layer, removing portions of the dielectric cap layer, the seed layer and the buffer layer from the top surface of the template layer to provide a stack of a buffer structure, a seed structure and a dielectric cap overlying the bottom surface of the trench, and growing a single crystal semiconductor structure within the trench using a vapor liquid solid epitaxy growth process. The single crystal semiconductor structure is grown from a liquid-solid interface between the seed structure and the buffer structure. In some embodiments, growing the single crystal semiconductor structure includes heating the substrate, the buffer structure, the seed structure and the dielectric cap in the presence of a semiconductor precursor gas. In some embodiments, the substrate, the buffer structure, the seed structure and the dielectric cap are heated to a temperature such that the seed structure is melted to be in a liquid form. In some embodiments, the method further includes supplying the semiconductor precursor gas comprising a silicon precursor or a germanium precursor. In some embodiments, depositing the buffer layer includes depositing aluminum oxide or molybdenum dioxide.

Still another aspect of this description relates to a semiconductor device. The semiconductor device includes a template layer over a substrate, a buffer structure over a bottom surface of a trench in the template layer, a single crystal semiconductor structure over the buffer structure to fill the trench, and a gate structure over a channel region of the single crystal semiconductor structure. In some embodiments, the buffer structure includes aluminum oxide or molybdenum dioxide. In some embodiments, the buffer structure contacts a sub-surface of the template layer. In some embodiments, the buffer structure contacts a surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a template layer over a substrate, the template layer comprising a dielectric material;
a first transistor comprising:
a first buffer structure over a bottom surface of a first trench in the template layer;
a first single crystal semiconductor structure over the first buffer structure, the first single crystal semiconductor structure comprising a p-channel material;
a first gate structure over a channel portion of the first single crystal semiconductor structure; and
first source/drain structures on opposite sides of the first gate structure; and
a second transistor comprising:
a second buffer structure over a bottom surface of a second trench in the template layer;
a second single crystal semiconductor structure over the second buffer structure, the second single crystal semiconductor structure comprising an n-channel material;
a second gate structure over a channel portion of the second single crystal semiconductor structure; and
second source/drain structures on opposite sides of the second gate structure,
wherein a depth of each of the first trench and the second trench is less than a thickness of the template layer such that sidewalls and a bottom of each of the first buffer structure and the second buffer structure are in contact with the template layer.

2. The semiconductor device of claim 1, wherein the p-channel material is silicon, and the n-channel material is germanium.

3. The semiconductor device of claim 1, wherein the substrate comprises silicon.

4. The semiconductor device of claim 1, wherein the substrate is a glass substrate, a quartz substrate, a metal substrate or a plastic substrate.

5. The semiconductor device of claim 1, wherein the template layer comprises an amorphous dielectric material.

6. The semiconductor device of claim 1, wherein the template layer comprises silicon dioxide or silicon nitride.

7. The semiconductor device of claim 1, wherein the first buffer structure and the second buffer structure comprise aluminum oxide or molybdenum dioxide.

8. The semiconductor device of claim 1, wherein a top surface of each of the first single crystal semiconductor structure and the second single crystal semiconductor structure is coplanar with a top surface of the template layer.

9. The semiconductor device of claim 1, wherein the first and second single crystal semiconductor structures have a (111) crystallographic orientation.

10. A semiconductor device, comprising:
a template layer disposed over a substrate and comprising a first trench and a second trench therein;
a first buffer structure over a bottom surface of the first trench and a second buffer structure over a bottom surface of the second trench;
a first transistor comprising:
a first single crystal semiconductor structure over the first buffer structure, the first single crystal semiconductor structure comprising a first semiconductor material;
a first gate structure over a channel portion of the first single crystal semiconductor structure; and
first source/drain structures on opposite sides of the first gate structure; and
a second transistor comprising
a second single crystal semiconductor structure over the second buffer structure, the second single crystal semiconductor structure comprising a second semiconductor material different from the first semiconductor material;
a second gate structure over a channel portion of the second single crystal semiconductor structure; and
second source/drain structures on opposite sides of the second gate structure.

11. The semiconductor device of claim 10, wherein a depth of each of the first trench and the second trench is less than a thickness of the template layer such that sidewalls and a bottom of each of the first buffer structure and the second buffer structure are in contact with the template layer.

12. The semiconductor device of claim 10, wherein a depth of each of the first trench and the second trench is equal to a thickness of the template layer such that each of the first buffer structure and the second buffer structure is in direct contact with a top surface of the substrate.

13. The semiconductor device of claim 10, wherein the first single crystal semiconductor structure comprises silicon, and the second single crystal semiconductor structure comprises germanium.

14. The semiconductor device of claim 10, wherein the template layer comprises a dielectric material.

15. The semiconductor device of claim 10, wherein the first buffer structure and the second buffer structure comprise aluminum oxide or molybdenum dioxide.

16. The semiconductor device of claim 10, wherein the first buffer structure and the second buffer structure have a thickness ranging from 0.5 nm to 1 nm.

17. A semiconductor device, comprising:
a template layer disposed over a substrate and having a plurality of trenches therein, wherein the template layer comprises a dielectric material
a first transistor comprising:
a first single crystal semiconductor structure disposed within a first trench of the plurality of trenches, the first single crystal semiconductor structure comprising silicon;
a first buffer structure beneath the first single crystal semiconductor structure;
a first gate structure over a first channel region of the first single crystal semiconductor structure; and
first source/drain regions in portions of the first single crystal semiconductor structure laterally surrounding the first channel region, the first source/drain regions comprising dopants of a first conductivity type; and
a second transistor comprising:
a second single crystal semiconductor structure disposed within a second trench of the plurality of trenches, the second single crystal semiconductor structure comprising germanium;
a second buffer structure beneath the second single crystal semiconductor structure;
a second gate structure over a second channel region of the second single crystal semiconductor structure; and
second source/drain regions in portions of the second single crystal semiconductor structure laterally surrounding the second channel region, the second source/drain regions comprising dopants of a second conductivity type different from the first conductivity type.

18. The semiconductor device of claim 17, wherein the dielectric material is an amorphous material.

19. The semiconductor device of claim 17, wherein each of the first single crystal semiconductor structure and the second single crystal semiconductor structure is a semiconductor fin.

20. The semiconductor device of claim 17, wherein the first buffer structure and the second buffer structure comprise aluminum oxide or molybdenum dioxide.

\* \* \* \* \*